United States Patent
Lever

(10) Patent No.: US 6,657,917 B2
(45) Date of Patent: Dec. 2, 2003

(54) SELECTIVE ADJUSTMENT OF VOLTAGE CONTROLLED OSCILLATOR GAIN IN A PHASE-LOCKED LOOP

(75) Inventor: Andrew M. Lever, Old Woking (GB)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 09/896,946

(22) Filed: Jul. 2, 2001

(65) Prior Publication Data

US 2003/0001679 A1 Jan. 2, 2003

(51) Int. Cl.[7] .............................. G11C 7/00; H03L 7/00; H03L 7/06
(52) U.S. Cl. ..................... 365/233; 365/194; 327/156; 327/157; 327/159; 331/1 R; 331/11; 331/DIG. 2
(58) Field of Search ................................ 365/233, 194; 331/1 R, 11, DIG. 2; 327/156, 157, 159

(56) References Cited

U.S. PATENT DOCUMENTS

| | | | |
|---|---|---|---|
| 5,031,145 A | 7/1991 | Lever | 365/185 |
| 5,208,546 A * | 5/1993 | Nagaraj et al. | 327/157 |
| 5,528,603 A | 6/1996 | Canella et al. | 371/25.1 |
| 5,786,733 A * | 7/1998 | Yamaguchi | 331/11 |
| 5,886,551 A * | 3/1999 | Narahara | 327/157 |
| 5,926,047 A | 7/1999 | Harrison | 327/159 |
| 5,940,608 A | 8/1999 | Manning | 395/558 |
| 6,011,732 A | 1/2000 | Harrison et al. | 365/194 |
| 6,049,241 A | 4/2000 | Brown et al. | 327/295 |
| 6,111,448 A | 8/2000 | Shibayama | 327/293 |
| 6,111,925 A | 8/2000 | Chi | 375/354 |
| 6,114,917 A | 9/2000 | Nakajima et al. | 331/57 |
| 6,128,248 A | 10/2000 | Idei et al. | 365/233 |
| 6,150,856 A | 11/2000 | Morzano | 327/149 |
| 6,181,756 B1 * | 1/2001 | Moloudi | 375/374 |
| 6,198,357 B1 | 3/2001 | O'Toole et al. | 331/57 |
| 6,205,086 B1 | 3/2001 | Hanzawa et al. | 365/233 |
| 6,216,256 B1 | 4/2001 | Inoue et al. | 716/6 |
| 6,278,332 B1 * | 8/2001 | Nelson et al. | 331/17 |
| 6,466,069 B1 * | 10/2002 | Rozenblit et al. | 327/157 |
| 6,469,584 B1 * | 10/2002 | Eker et al. | 331/11 |

OTHER PUBLICATIONS

Yang, Howard C., et al., IEEE Journal of Solid–State Circuits, vol. 32, No. 4, Apr. 1997, pp. 582–586. "Low Jitter 0.3–165 MHZ CMOS PLL Frequency Synthesizer For 3V/5V Operation".

* cited by examiner

Primary Examiner—Son Mai
(74) Attorney, Agent, or Firm—Whyte Hirschboeck Dudek SC

(57) ABSTRACT

A phase locked loop system for use with a synchronous dynamic random access memory (SDRAM) or a multi-rate high speed serial transmission buffer is disclosed. The invention includes a phased lock loop having a control voltage for controlling a voltage-controlled oscillator (VCO) that is adjusted, based upon whether the control voltage is within a specific voltage range and whether the VCO frequency is within a specific frequency range. If the control voltage is greater than a voltage maximum and the frequency is not beyond a frequency maximum, the VCO sensitivity is increased. If the control voltage is less than a voltage minimum and the frequency is not below a frequency minimum, the VCO sensitivity is decreased. This ensures that any signal noise or jitter does not have a proportionately large portion of the signal, and therefore minimizes its effect. The VCO sensitivity is increased or decreased by increasing or decreasing the gain of the VCO block respectively to maintain the proper sensitivity to noise while in the defined control voltage range and VCO frequency range.

41 Claims, 3 Drawing Sheets

SELECTIVE ADJUSTMENT OF VOLTAGE CONTROLLED OSCILLATOR GAIN IN A PHASE-LOCKED LOOP

BACKGROUND OF THE INVENTION

The present invention relates generally to the field of integrated circuits. More particularly, the invention relates to a phase locked loop circuit having reduced sensitivity to noise. The invention is used to improve the synchronization of the internal timing or clock signals within an integrated circuit such as a synchronous dynamic random access memory (SDRAM) to external timing or clock signals. The invention is also used in multi-rate high speed transmission buffers.

Most digital logic implemented on integrated circuits is clocked synchronous sequential logic. In electronic devices such as synchronous dynamic random access memory circuits (SDRAMs), microprocessors, digital signal processors, and so forth, the processing, storage, and retrieval of information is coordinated with a clock signal. The speed and stability of the clock signal determines to a large extent the data rate at which a circuit can function. Many high-speed integrated circuit devices, such as SDRAMs, microprocessors, etc., rely upon clock signals to control the flow of commands, data, addresses, etc., into, through and out of the devices.

A continual demand exists for devices with higher data rates; consequently, circuit designers have begun to focus on ways to increase the frequency of the clock signal. In SDRAMs, it is desirable to have the data output from the memory synchronized with the system clock that also serves the microprocessor. The delay between a rising edge of the system clock (external to the SDRAM) and the appearance of valid data at the output of the memory circuit is known as the clock access time of the memory. A goal of memory circuit designers is to minimize clock access time as well as to increase clock frequency.

One of the obstacles to reducing clock access time has been clock skew, that is, the delay time between the externally supplied system clock signal and the signal that is routed to the memory's output circuitry. An external system clock is generally received with an input buffer and then further shaped and redriven to the internal circuitry by an internal buffer. The time delay of the input buffer and the internal buffer will skew the internal clock from the external clock. This clock skew will cause signals that are to be transferred from the integrated circuit to be out of synchronization with the external system clock. This skew in the clock signal internal to the integrated circuit is furthered by the delays incurred in the signal passing through the clock input buffer and driver and through any associated resistive-capacitive circuit elements. One solution to the problem of clock skew is the use of a synchronous mirror delay. One problem with the synchronous mirror delay is that, although these type of delays require fewer clock cycles to achieve lock of an external clock signal and an internal clock signal, the synchronous mirror delay has a limited operational frequency range. Another solution to the problem of clock skew is the use of a phase locked loop (PLL) that has a greater operational frequency range. A PLL is capable of tracking phase as well as frequency of the clock signal. A typical PLL includes a voltage control oscillator (VCO). The VCO outputs a signal with frequency corresponding to a voltage. Because of the relatively large bandwidth of PLLs, oftentimes they are operated on the lower frequencies of the bandwidth. It has been found that the voltage signals controlling the VCOs are sensitive to noise, particularly at the lower frequencies. At lower voltage levels, voltage noise (or jitter) has a proportionally greater effect on the signal. Therefore, it is desirable to reduce the amount of noise or jitter on the control voltage of the VCO. At the same time, it is desired to maintain the locking function of the PLL.

SUMMARY OF THE INVENTION

The present invention solves the aforementioned problems, and decreases the amount of noise or jitter on the control voltage of a voltage controlled oscillator.

In one aspect of the invention, a method of decreasing voltage controlled oscillator noise susceptibility and a phase locked loop is disclosed. The method includes providing a phased lock loop (PLL) having a voltage controlled oscillator (VCO) and controlled by a control voltage VCTRL and having a VCO frequency. A desired voltage range is defined from a minimum voltage to a maximum voltage and a desired frequency range is defined from a minimum frequency to a maximum frequency. The method includes comparing the VCO frequency to the minimum frequency and the maximum frequency, and comparing VCTRL to the minimum voltage and the maximum voltage, and selectively adjusting a gain of the VCO under specific VCTRL voltage and VCO frequency conditions as determined by the comparison steps.

In another aspect of the invention, a method of adjusting noise sensitivity in a phase locked loop includes providing a phase locked loop having a voltage controlled oscillator (VCO) controlled by a control voltage VCTRL and having a VCO frequency. The method includes decreasing a gain of the VCO when the VCTRL is less than a defined voltage minimum and when the VCO frequency is not less than a defined frequency minimum. The method also includes increasing a gain of the VCO when the VCTRL is greater than a defined voltage maximum and when the VCO frequency is not greater than a defined frequency maximum.

In another aspect of the invention, a phase locked loop circuit is disclosed and includes a voltage controlled oscillator for generating a VCO frequency controlled by a control voltage VCTRL. The circuit includes a frequency comparator to compare a reference frequency with the VCO frequency and output a frequency comparison result signal. A phase and frequency detector is disclosed with a charge pump connected to the PFD and outputting the control voltage VCTRL. A filter is included to filter a target frequency range from the control voltage VCTRL, and a voltage comparator is connected to the charge pump for comparing the control voltage to a voltage maximum and a voltage minimum. The voltage comparator outputs a voltage comparison result signal. Control logic connected to the voltage comparator and the frequency comparator selectively adjusts VCO gain based on the voltage comparison result signal and the frequency comparison result signal.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
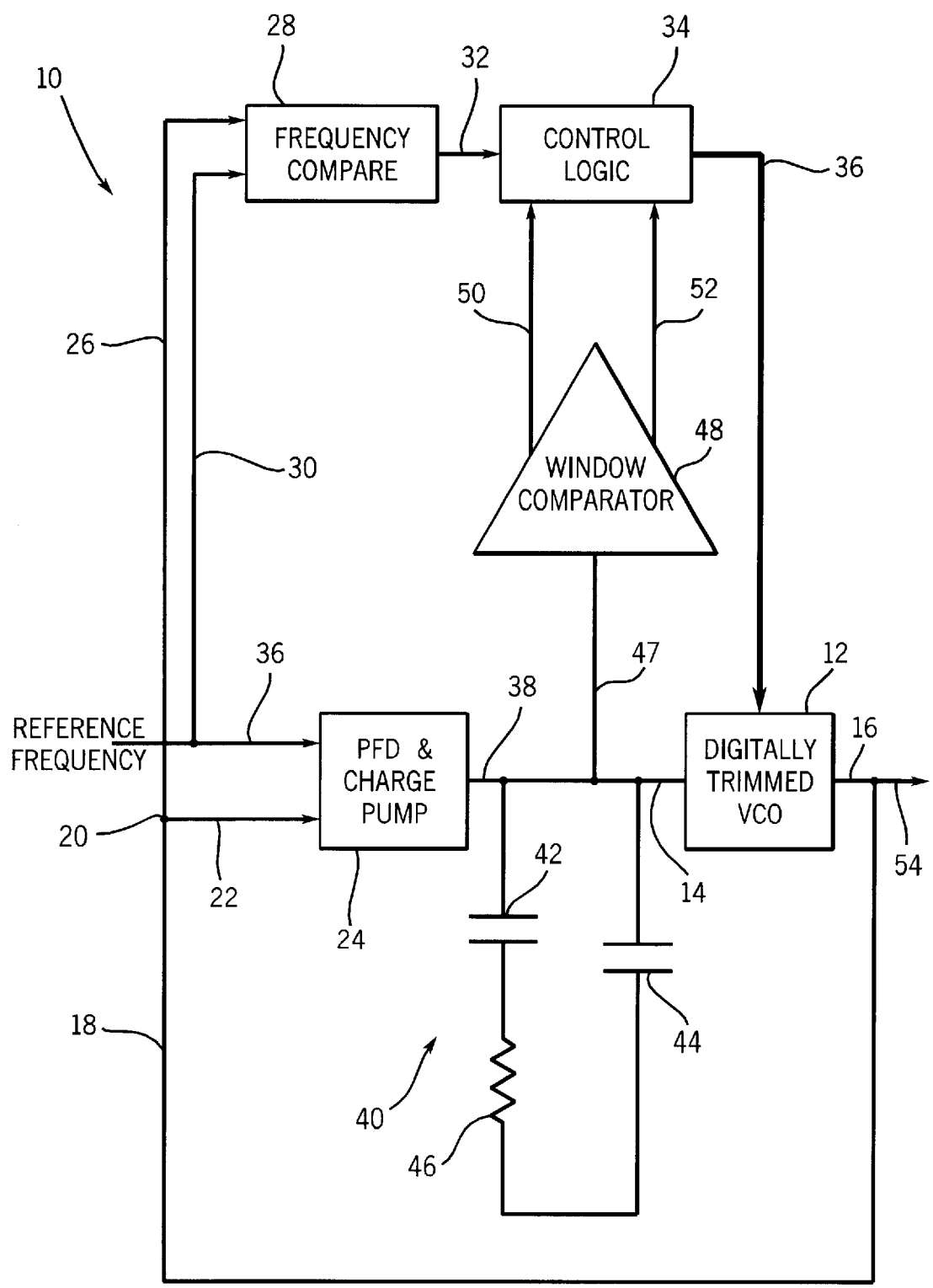
FIG. 1 is a circuit diagram of a phased lock loop circuit in accordance with the present invention.

Referring to FIG. 1, a preferred embodiment of the invention is exemplified and a circuit identified generally by the reference numeral 10. Circuit 10 is referred to as a phase locked loop (PLL), which is used to synchronize an external clock signal to an internal clock signal for an integrated circuit. PLL 10 is also contemplated as being used in, for example, a multi-rate high speed transmission buffer. PLL 10 includes a voltage controlled oscillator (VCO) 12. The VCO 12 produces an AC output having a frequency that is proportional to an input control voltage (or VCTRL) on line 14. Frequency output by VCO 12 is output through line 16. The signal is fed back through loop 18, and this signal has a VCO frequency. At node 20, loop 18 breaks into two branches, with branch 22 being used as an input to a phase and frequency detector (PFD) and a charge pump connected to the PFD (represented together by 24). Node 20 also breaks into branch 26 which is used as an input to a frequency comparator 28. Frequency comparator 28 compares signal 26, which has the VCO frequency, with a reference frequency 30. Frequency comparator 28 will determine whether the VCO frequency is larger than a frequency maximum, or lower than a frequency minimum, with respect to reference frequency 30. Frequency comparator 28 then outputs a signal 32, or frequency comparison result signal, to control logic 34. Reference frequency 30 is also used as an input 36 to PFD and charge pump block 24. The PFD takes the return signal 22 from loop 18 and compares it to reference frequency input 36. The reference frequency is windowed with a minimum frequency and a maximum frequency, to guarantee that if VCO frequency is equal to the reference frequency, then the output will not be too high or too low, respectively. In general, it is advantageous to have a smaller window, with the present invention having a preferred window of plus or minus 1% of the reference frequency. The PFD outputs a signal corresponding to the frequency deviation and phase deviation of signal 22 with respect to the input signal 36. The output 38 of the PFD is a charge proportional to the phase difference. The output 38 is integrated and filtered by 42, 44 and 46 to produce VCTRL. Therefore, filter 40 is employed to eliminate, for example, a high frequency component, and therefore may be configured as a low-pass filter which may be varied by the values of capacitor components 42 and 44 as well as resistor 46 in a typical RC layout. Other filter arrangements and configurations are contemplated to obtain the desired filtering effect upon VCTRL. The resultant signal is sampled 47 by a comparator 48, preferably a window comparator. Once the comparator 48 is able to sample the VCTRL, it can determine whether VCTRL is outside a pre-defined window defined by a voltage minimum to a voltage maximum. Comparator 48 inputs signals 50 and 52 (which may be referred to as voltage comparison result signals) into control logic 34, where it is determined whether VCTRL is greater than a maximum voltage or less than a minimum voltage. Control logic 34 then takes the results of frequency comparator 28 and voltage comparator 48 and makes a determination as to any adjustments that must be made in VCO 12 based on the voltage level of VCTRL as well as its frequency level. Control logic 34, through control line 36, makes any adjustments to VCO that are necessary. The present invention contemplates that control logic 34 would adjust the gain of VCO under particular circumstances. These circumstances include specific voltage and frequency conditions of the VCTRL and the VCO frequency. The increase or decrease in VCO gain corresponds to an increase or decrease in VCTRL sensitivity to signal noise. The now-adjusted VCO is again output through VCO frequency output 16. This process will continue until VCO output signal 16 settles, which may occur after many clock cycles, and when the signal does settle, it is output 54 to be used to synchronize the external clock with an internal clock of an integrated circuit. It is contemplated that any suitable control logic 34 may be used in order to receive the results of the frequency comparison as well as the voltage comparison, and implement if needed, any VCO adjustments that are required. It is contemplated that VCO in a preferred embodiment, is trimmed via a digital code. The net effect is that the sensitivity of the VCO block is adjusted outside the normal PLL loop to guarantee that the control voltage stays within the pre-defined range. The frequency comparison is done to make sure that the control voltage is not outside the desired frequency window. When the gain of the VCO block is reduced, the sensitivity of the VCO to noise, and consequently signal jitter, is also reduced.

Figure 2:
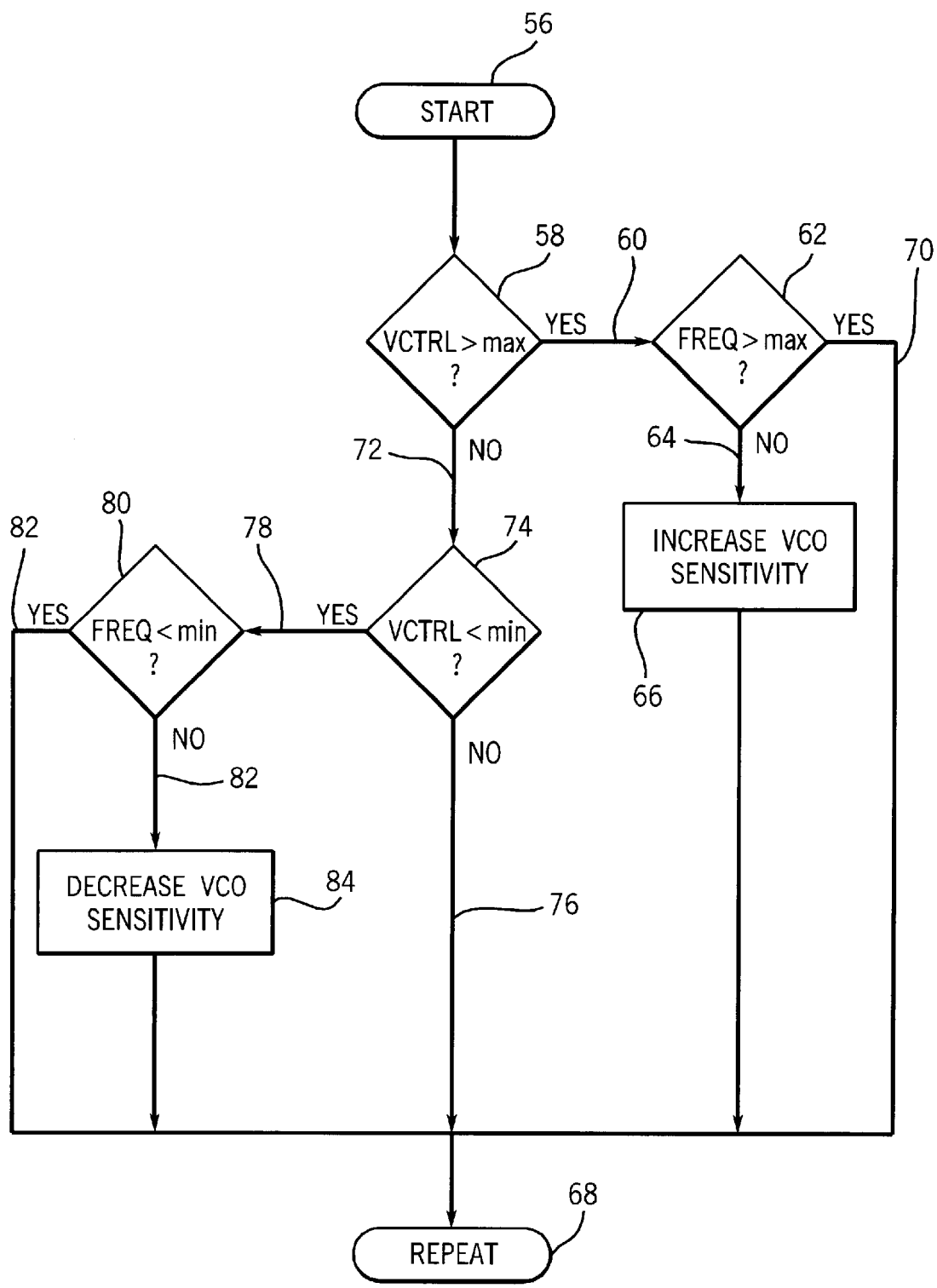
FIG. 2 is a block diagram illustrating the frequency and control voltage checks in accordance with one method of the present invention.

Referring now to FIG. 2, the flowchart illustrating the method of the present invention is shown. It is to be understood that this is representative of one cycle, and consequently many more cycles may be implemented prior to settling of the circuit. The method of the present invention illustrates having both voltage range checks as well as frequency range checks. In starting 56 it is determined 58 whether VCTRL is greater than a voltage maximum. If yes 60, it is also determined 62 whether the frequency of VCO is greater than a frequency maximum. If not 64, the sensitivity of the VCO is increased 66. This may be accomplished by, for example, increasing the gain of the VCO block. Following this adjustment, the cycle may be repeated 68. If the frequency is greater than a frequency maximum 70, no adjustments are made. The problem targeted by the present invention is for a wide bandwidth PLL where the sensitivity to noise of VCTRL occurs when the frequencies are not out of range when the control voltage VCTRL is. At this point the process again may be repeated 68. If during determination 58 it is determined that VCTRL is not greater than a maximum voltage 72 it is also determined 74 whether VCTRL is less than a voltage minimum. In other words, is VCTRL outside the desired voltage range. If not 76, no adjustments are made and the process may be repeated 68. If, however, VCTRL is less than a voltage minimum 78 a further check is made to determine 80 whether the frequency output from VCO is less than a frequency minimum. If not 82, it is an indication that even though VCTRL is outside the desired voltage range, the frequency is still above a frequency minimum and therefore it is necessary to decrease VCO sensitivity to signal noise 84. Again, this may be accomplished by decreasing the gain of the VCO block. If, however, it is determined that the frequency is less than a frequency minimum 82, a condition exists under which both control voltage and the frequency are less than desired minimums, and therefore the process is repeated 68 since the frequency follows the control voltage and both are outside a minimum range. The frequency and voltage comparison system recognizes that, if the control voltage is not within a given range, and the control voltage is above a voltage maximum, then the frequency should also be above the frequency maximum as well. Correspondingly, if the control voltage is not within the voltage range, and in fact is less than a control voltage minimum, the frequency should also be below a frequency minimum as well. It is when the frequency on the low end of the range, is not below its minimum at the same time that VCTRL is below its minimum voltage. Additionally, if VCTRL is greater than its voltage maximum, it is also required that the frequency also be above its frequency maximum. Adjustments will only be made when the frequency does not follow the voltage in this pattern. The selective adjusting of VCO noise sensitivity under the specific VCTRL voltage and VCO frequency conditions are determined by the comparing steps. Again, selectively adjusting or changing the VCO noise sensitivity includes decreasing a gain of the VCO when VCTRL is greater than the maximum voltage and when the VCO frequency is less than the minimum frequency, and may include increasing a gain of the VCO when the VCTRL is greater than the maximum voltage and when the VCO frequency is not greater than the maximum frequency.

Figure 3:
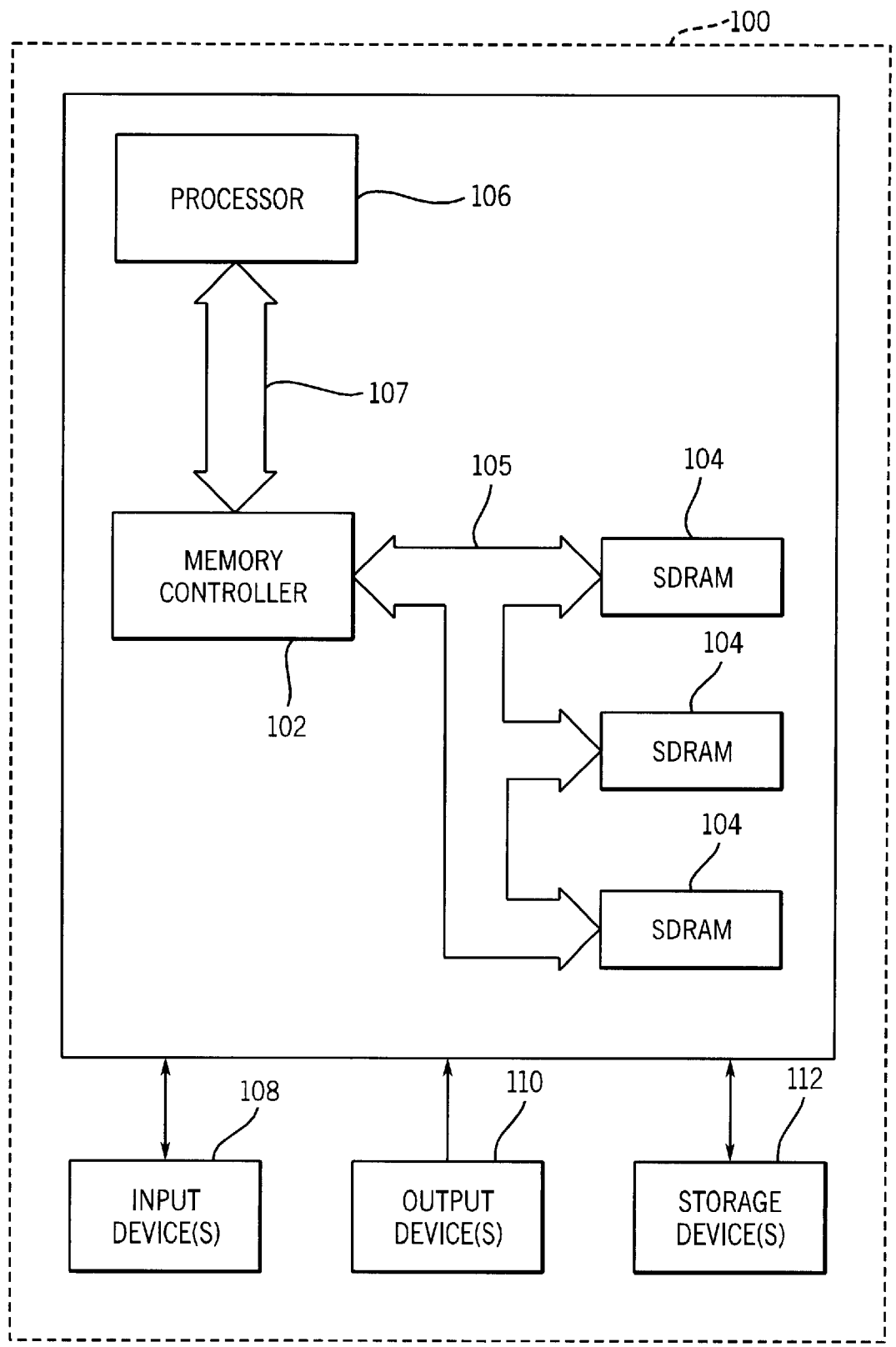
FIG. 3 is a block diagram illustrating a system in which the present invention may be used.

FIG. 3 is a block diagram of a computer system 100 in which the present invention may be used. Other applications are possible and contemplated, such as in a multi-rate high speed transmission buffer. The computer system 100 utilizes a memory controller 102 in communication with SDRAMs 104 through a bus 105. The memory controller 102 is also in communication with a processor 106 through a bus 107. The processor 106 can perform a plurality of functions based on information and data stored in the SDRAMs 104. one or more input devices 108, such as a keypad or a mouse, are connected to the processor 106 to allow an operator to manually input data, instructions, etc. One or more output devices 110 are provided to display or otherwise output data generated by the processor 106. Examples of output devices include printers and video display units. One or more data storage devices 112 may be coupled to the processor 106 to store data on, or retrieve information from, external storage media. Examples of storage devices 112 and storage media include drives that accept hard and floppy disks, tape cassettes, and CD read only memories.

While the present invention has been described in conjunction with preferred embodiments thereof, many modifications and variations will be apparent to those of ordinary skill in the art. For example, although the present invention is disclosed as being implemented with specific logic components, the present invention is contemplated to be used with any implementable logic devices and in other arrangements, that will perform the functionalities heretofore described. The foregoing description and the following claims are intended to cover all such modifications and variations.

What is claimed is:

1. A method of decreasing voltage controlled oscillator noise susceptibility in a phase locked loop comprising:
   providing a phase locked loop (PLL) having a voltage controlled oscillator (VCO) controlled by a control voltage VCTRL and having a VCO frequency, and defining a desired voltage range from a minimum voltage to a maximum voltage and a desired frequency range from a minimum frequency to a maximum frequency;
   comparing the VCO frequency to the minimum frequency and the maximum frequency;
   comparing VCTRL to the minimum voltage and the maximum voltage; and
   selectively adjusting a gain of the VCO under specific VCTRL voltage and VCO frequency conditions as determined by the comparing steps.

2. The method of claim 1 wherein selectively adjusting the gain of VCO includes decreasing the gain of VCO when VCTRL is less that the minimum voltage and when the VCO frequency is not less than the minimum frequency.

3. The method of claim 1 wherein selectively adjusting the gain of VCO includes increasing the gain of VCO when the VCTRL is greater than a voltage maximum and when the VCO frequency is not greater than the maximum frequency.

4. A method of decreasing voltage controlled oscillator noise susceptibility in a phase locked loop comprising:
   providing a phase locked loop (PLL) having a voltage controlled oscillator (VCO) controlled by a control voltage VCTRL and having a VCO frequency, and defining a desired voltage range from a minimum voltage to a maximum voltage and a desired frequency range from a minimum frequency to a maximum frequency;
   comparing the VCO frequency to the minimum frequency and the maximum frequency;
   comparing VCTRL to the minimum voltage and the maximum voltage; and
   selectively adjusting VCO noise sensitivity under specific VCTRL voltage and VCO frequency conditions as determined by the comparing steps.

5. The method of claim 4 wherein selectively adjusting the VCO noise sensitivity includes decreasing a gain of the VCO when VCTRL is less than the minimum voltage and when the VCO frequency is not less than the minimum frequency.

6. The method of claim 4 wherein selectively adjusting the VCO noise sensitivity includes increasing a gain of the VCO when the VCTRL is greater than the maximum voltage and when the VCO frequency is not greater than the maximum frequency.

7. A phase locked loop (PLL) comprising:
   a voltage controlled oscillator (VCO) controlled by a control voltage VCTRL and having a VCO frequency;
   a frequency comparator to compare a reference frequency with the VCO frequency and outputting a frequency comparison result signal;
   a voltage comparator for comparing the control voltage to a voltage maximum and a voltage minimum and outputting a voltage comparison result signal; and
   control logic connected to the frequency comparator and the voltage comparator to selectively adjust the VCO noise sensitivity based on the frequency comparison result signal and the voltage comparison result signal.

8. A phase locked loop (PLL) comprising;
   a voltage control oscillator (VCO) controlled by a control voltage VCTRL and having a VCO frequency;
   a frequency comparator to compare a reference frequency with the VCO frequency and outputting a frequency comparison result signal;
   a voltage comparator for comparing the control voltage to a voltage maximum and a voltage minimum and outputting a voltage comparison result signal; and
   control logic connected to the frequency comparator and the voltage comparator to selectively adjust the VCO gain based on the frequency comparison result signal and the voltage comparison result signal.

9. The phase locked loop of claim 8 wherein the gain of the voltage control oscillator (VCO) is decreased when the VCTRL is less than a defined voltage minimum and when the VCO frequency is not less than a defined frequency minimum.

10. A frequency and voltage comparison system for use in a phase locked loop having a voltage controlled oscillator (VCO) having a VCO frequency and a control voltage VCTRL, the system comprising:
- a frequency comparator connected to a feedback loop of the VCO to compare a reference frequency with the VCO frequency and outputting a frequency comparison result signal;
- a voltage comparator connected to a charge pump for comparing the control voltage to a voltage maximum and a voltage minimum and outputting a voltage comparison result signal; and
- control logic connected to the voltage comparator and the frequency comparator to selectively adjust the VCO gain based on the voltage and frequency comparison result signals;
- wherein a gain of the voltage control oscillator (VCO) is decreased when the VCTRL is less than a defined voltage minimum and when the VCO frequency is not less than a defined frequency minimum; and
- wherein a gain of VCO is increased when the VCTRL is greater than a defined voltage maximum and when the VCO frequency is not greater than a defined frequency maximum.

11. The system of claim 10 wherein the voltage comparator is a window comparator.

12. A frequency comparison and voltage comparison system for use in a phase locked loop having a voltage controlled oscillator (VCO) having a VCO frequency and a control voltage VCTRL, the system comprising:
- a frequency comparator connected to a feedback loop of the VCO to compare a reference frequency with the VCO frequency and outputting a frequency compare result signal;
- a voltage comparator connected to a charge pump for comparing the control voltage to a voltage maximum and a voltage minimum and outputting a voltage compare result signal; and
- control logic connected to the voltage comparator to selectively adjust the VCO gain based on the frequency compare result signal;
- wherein a gain of the VCO is selectively adjusted under specific VCTRL voltage and VCO frequency conditions.

13. The phase lock loop circuit of claim 12 wherein the VCO gain is decreased when VCTRL is less than a voltage minimum and the VCO frequency is not less than a frequency minimum.

14. The phase lock loop circuit of claim 12 wherein the VCO gain is increased when VCTRL is greater than a voltage maximum and the VCO frequency is not greater than a frequency maximum.

15. A system comprising:
- a processor;
- a memory controller;
- a plurality of memory devices;
- a first bus interconnecting the processor and the memory controller;
- a second bus interconnecting the memory controller and the memory devices;
- each of the memory devices having:
  - a phase locked loop (PLL) comprising;
    - a voltage control oscillator (VCO) controlled by a control voltage VCTRL and having a VCO frequency;
    - a frequency comparator to compare a minimum frequency and a maximum frequency with the VCO frequency;
    - a voltage comparator connected to a charge pump for comparing the VCTRL to a voltage maximum and a voltage minimum; and
    - control logic connected to the voltage comparator to selectively adjust a VCO gain;
  - wherein the gain of the VCO is selectively adjusted under specific VCTRL voltage and VCO frequency conditions.

16. The system of claim 15 wherein the gain of the VCO is decreased when the VCTRL is less than the voltage minimum and when the VCO frequency is not less than the minimum frequency.

17. The system of claim 15 wherein the gain of the VCO is increased when the VCTRL is greater than the voltage maximum and when the VCO frequency is not greater than the maximum frequency.

18. A synchronous dynamic random access memory (SDRAM) comprising:
- a memory control; and
- a phase locked loop system connected to the memory control, the phase locked loop further including:
  - a voltage control oscillator (VCO) controlled by a control voltage VCTRL and having a VCO frequency;
  - a frequency comparator to compare a minimum frequency and a maximum frequency with the VCO frequency;
  - a voltage comparator connected to a charge pump for comparing the control voltage to a voltage maximum and a voltage minimum; and
  - control logic connected to the voltage comparator to selectively adjust the VCO gain;
- wherein a gain of the voltage control oscillator (VCO) is decreased when the VCTRL is less than the voltage minimum and when the VCO frequency is not less than the minimum frequency; and
- wherein a gain of VCO is increased when the VCTRL is greater than the voltage maximum and when the VCO frequency is not greater than the maximum frequency.

19. A synchronous dynamic random access memory (SDRAM) comprising:
- a memory control; and
- a phase locked loop system connected to the memory control, the phase locked loop further including:
  - a voltage control oscillator (VCO) controlled by a control voltage VCTRL and having a VCO frequency;
  - a frequency comparator to compare a reference frequency with the VCO frequency and outputting a frequency comparison result signal;
  - a voltage comparator connected to a charge pump for comparing the control voltage to a voltage maximum and a voltage minimum and outputting a voltage comparison result signal; and
  - control logic connected to the voltage comparator to selectively adjust the VCO gain based on the voltage and frequency comparison result signals;
- wherein VCO sensitivity is selectively adjusted under specific frequency and voltage conditions.

20. The system of claim 19 wherein the VCO has a VCO gain and wherein the VCO gain is decreased when VCTRL is less than a voltage minimum and the VCO frequency is not less than a frequency minimum.

21. The system of claim 19 wherein the VCO gain is increased when VCTRL is greater than a voltage maximum and the VCO frequency is not greater than a frequency maximum.

22. A phase locked loop circuit comprising:
a voltage-controlled oscillator (VCO) for generating a VCO frequency controlled by a control voltage VCTRL;
a frequency comparator to compare a reference frequency with the VCO frequency and outputting a frequency comparison result signal;
a phase and frequency detector (PFD);
a charge pump connected to the PFD and outputting the control voltage VCTRL;
a filter to filter a target frequency range from the control voltage VCTRL;
a voltage comparator connected to the charge pump for comparing the control voltage to a voltage maximum and a voltage minimum and outputting a voltage comparison result signal; and
control logic connected to the voltage comparator to selectively adjust the VCO gain based on the voltage comparison result signal and the frequency comparison result signal.

23. The phase locked loop circuit of claim 22 wherein the VCO has a VCO gain amid wherein the VCO gain is decreased when VCTRL is less than a voltage minimum and the VCO frequency is not less than a frequency minimum.

24. The phase locked loop circuit of claim 23 wherein when the VCO gain is increased when VCTRL is greater than a voltage maximum and the VCO frequency is not greater than a frequency maximum.

25. The phase locked loop circuit of claim 23 wherein when the VCO gain is decreased, the VCTRL sensitivity to signal noise is decreased.

26. The phase locked loop circuit of claim 24 wherein when the VCO gain is increased, the VCTRL sensitivity to signal noise is increased.

27. A method of reducing noise sensitivity in a phase locked loop comprising:
providing a phase locked loop baying a voltage controlled oscillator (VCO) controlled by a control voltage VCTRL and having a VCO frequency;
directing a signal representative of the VCO frequency into a frequency comparator having a defined minimum frequency and a defined maximum frequency;
directing a signal representative of a reference frequency into the frequency comparator;
directing a signal representative of VCTRL into a voltage comparator having a defined minimum voltage and a defined maximum voltage;
comparing the VCO frequency to the minimum frequency and the maximum frequency;
comparing VCTRL to the defined minimum voltage and the defined maximum voltage; and
selectively adjusting the VCO noise sensitivity based on the results of the comparing steps.

28. The method of claim 27 wherein selectively adjusting the VCO noise sensitivity includes decreasing a gain of the VCO when VCTRL is less than the minimum voltage and when the VCO frequency is not less than the minimum frequency.

29. The method of claim 27 wherein selectively adjusting the VCO noise sensitivity includes increasing a gain of the VCO when the VCTRL is greater than the maximum voltage and when the VCO frequency is not greater than the maximum frequency.

30. A method of reducing noise sensitivity in a phase locked loop comprising:
providing a phase locked loop having a voltage controlled oscillator (VCO) controlled by a control voltage VCTRL and having a VCO frequency;
directing a signal representative of the VCO frequency into a frequency comparator having a defined minimum frequency and a defined maximum frequency;
directing a signal representative of a reference frequency into the frequency comparator;
directing a signal representative of VCTRL into a voltage comparator having a defined minimum voltage and a defined maximum voltage;
comparing the VCO frequency to the defined minimum frequency and the maximum frequency;
comparing VCTRL to the defined minimum voltage and the defined maximum voltage; and
digitally adjusting the VCO noise sensitivity based on the results of the comparing steps.

31. The method of claim 27 wherein adjusting the VCO sensitivity based on the comparing steps includes:
decreasing a gain of the voltage control oscillator (VCO) when the VCTRL is less than the defined minimum voltage and when the VCO frequency is not less than the defined minimum frequency; and
increasing a gain of the VCO when the VCTRL is greater than the defined maximum voltage and when the VCO frequency is not greater than the defined maximum frequency.

32. The method of claim 30 wherein digitally adjusting the VCO noise sensitivity based on the results of the comparing steps includes:
decreasing a gain of the voltage control oscillator (VCO) when the VCTRL is less than the defined minimum voltage and when the VCO frequency is not less than the defined minimum frequency; and
increasing a gain of VCO when the VCTRL is greater than the defined maximum voltage and when the VCO frequency is not greater than the defined maximum frequency.

33. A method of decreasing phase lock loop sensitivity to input signal noise, the method comprising:
providing a phase lock loop having a voltage control oscillator (VCO), the VCO controlled by a control voltage VCTRL and having a VCO frequency;
providing a desired voltage range for VCTRL;
providing a desired frequency range for VCO;
determining whether VCTRL is within the desired voltage range;
determining whether the VCO frequency is within the desired frequency range; and
decreasing a gain of VCO when VCTRL is greater than the desired voltage range and when the VCO frequency is not less than the desired frequency range.

34. A method of decreasing phase lock loop sensitivity to input signal noise, the method comprising:
providing a phase lock loop having a voltage control oscillator (VCO), the VCO controlled by a control voltage VCTRL and having a VCO frequency;
providing a desired voltage range for VCTRL;
providing a desired frequency range for VCO;
determining whether VCTRL is within the desired voltage range;
determining whether the VCO frequency is within the desired frequency range; and selectively changing a gain of VCO.

35. The method of claim 34 wherein selectively changing the gain of the VCO includes decreasing a gain of the VCO when the VCTRL is less than a minimum of the desired voltage range and when the VCO frequency is not less than a minimum of the desired frequency range.

36. The method of claim 34 wherein selectively changing the gain of the VCO includes increasing a gain of the VCO when the VCTRL is greater than a maximum of the desired voltage range and when the VCO frequency is not greater than a maximum of the defined frequency range.

37. The phase locked loop of claim 7 wherein the phase locked loop is used in a multi-rate transmission buffer.

38. The phase locked loop of claim 8 wherein the phase locked loop is used in a multi-rate transmission buffer.

39. The frequency and voltage comparison system of claim 10 wherein the frequency and voltage comparison system is used in a multi-rate transmission buffer.

40. The frequency and voltage comparison system of claim 12 wherein the frequency and voltage comparison system is used in a multi-rate transmission buffer.

41. The phase locked loop circuit of claim 22 wherein the phase locked loop circuit is used in a multi-rate transmission buffer.

* * * * *

UNITED STATES PATENT AND TRADEMARK OFFICE
CERTIFICATE OF CORRECTION

PATENT NO. : 6,657,917 B2
DATED : December 2, 2003
INVENTOR(S) : Andrew M. Lever It is certified that error appears in the above-identified patent and that said Letters Patent is hereby corrected as shown below:

Column 9,
Line 23, replace "amid" with -- and --.
Line 38, replace "baying" with -- having --.

Signed and Sealed this

Second Day of March, 2004

JON W. DUDAS
*Acting Director of the United States Patent and Trademark Office*